(12) United States Patent
Huang et al.

(10) Patent No.: US 6,521,521 B1
(45) Date of Patent: Feb. 18, 2003

(54) BONDING PAD STRUCTURE AND METHOD FOR FABRICATING THE SAME

(75) Inventors: Chih-Kung Huang, Yi-Lang (TW); Ying-Chih Chen, Tai Chung (TW)

(73) Assignee: FU Sheng Industrial Co., Ltd., Taipei (TW)

( * ) Notice: Subject to any disclaimer, the term of this patent is extended or adjusted under 35 U.S.C. 154(b) by 0 days.

(21) Appl. No.: 09/522,867

(22) Filed: Mar. 9, 2000

Related U.S. Application Data

(62) Division of application No. 09/335,635, filed on Jun. 18, 1999, now abandoned.

(51) Int. Cl.⁷ ................................................. H01L 21/44
(52) U.S. Cl. ........................ 438/614; 438/612; 438/656; 438/678
(58) Field of Search ................................ 438/612, 613, 438/614, 652, 653, 656, 678, 685; 205/185

(56) References Cited

U.S. PATENT DOCUMENTS

| | | | | |
|---|---|---|---|---|
| 3,928,093 A | * | 12/1975 | van Tongerloo et al. | 438/134 |
| 4,016,050 A | * | 4/1977 | Lesh et al. | 257/763 |
| 5,652,434 A | * | 7/1997 | Nakamura et al. | 257/763 |
| 5,665,996 A | * | 9/1997 | Williams et al. | 257/766 |
| 5,767,546 A | * | 6/1998 | Williams et al. | 257/758 |
| 6,162,343 A | * | 12/2000 | Takami et al. | 205/185 |
| 6,258,415 B1 | * | 7/2001 | Troup-Packman | 205/185 |

* cited by examiner

Primary Examiner—Kevin M. Picardat
(74) Attorney, Agent, or Firm—J.C. Patents

(57) ABSTRACT

A bonding pad structure. A substrate having a first surface and a second surface is provided. A metal bonding pad and a bonding region are respectively located on the first surface and the second surface. Intermediate plated layers located are on the metal bonding pad and the bonding region. Under ball metallurgy layers are located on each of the intermediate plated layers such that each of the under ball metallurgy layers comprises a first plated layer and a second plated layer.

17 Claims, 3 Drawing Sheets

BONDING PAD STRUCTURE AND METHOD FOR FABRICATING THE SAME

CROSS-REFERENCE TO RELATED APPLICATION

This application is a divisional application of, and claims the priority benefit of, U.S. application Ser. No. 09/335,635 filed on Jun. 18, 1999, now abandoned.

BACKGROUND OF THE INVENTION

1. Field of Invention

The present invention relates to a bonding pad structure and a method for fabricating the same. More particularly, the present invention relates to a bonding pad structure of a power device and a method for fabricating the same.

2. Description of Related Art

As chip integration increases, various semiconductor packages are used, such as chip scale package or multi-chip module. However, a leadframe is usually used for packaging a low pin count chip such as a power device.

FIG. 1 is a schematic, three-dimensional diagram of a conventional power device.

Referring to FIG. 1, a conventional power device is formed on a substrate 100.

The power device includes a source region 102, a gate 104, an insulating layer 106 surrounding the gate 104 and a drain region 108 opposite the source region 102 and the gate 104. A material of the insulating layer 106 is phosphosilicate glass (PSG). The source region 102 is a stack made of a titanium layer (not shown), a titanium nitride layer (not shown) and an aluminum-silicon-copper alloy layer (not shown); the drain region 108 comprises the same material as the substrate 100.

FIG. 2 is a schematic, cross-sectional diagram of a conventional bonding pad structure of a power device.

Referring to FIG. 2, an aluminum bonding pad layer 204 is formed on a surface 202a of a substrate 200. A surface 202b of the substrate 200 is grounded to reduce the thickness of the substrate 200 after the semiconductor manufacturing processes are completed. An under ball metallurgy (UBM) layer 214a is formed on a portion of the aluminum bonding pad layer 204 located in a bonding pad window 206. The under ball metallurgy layer 214a is made of a titanium layer 208a, a nickel layer 210a and a silver layer 212a; the layers are formed by sputtering.

An under ball metallurgy layer 214b is then formed on a portion of a surface 202b located in a bonding region 216, and it is made from a titanium layer 208b, a nickel layer 210b and a silver layer 212b. The layers are formed by sputtering.

In the power device mentioned above, the under ball metallurgy layer 214a, 214b are individually formed in their own formation processes; thus, the manufacturing processes become complex. It is difficult to reduce the manufacturing costs.

Electroless plating is another method to form the under ball metallurgy layers. Since the layers on the aluminum bonding pad layer are different from those on the bonding region, various conditions are possible for the electroless plating process. For example, the substrate should be dipped into an alkaline solution to form a nickel layer on the bonding region. The substrate is dipped into an acidic solution to form a nickel layer on the aluminum bonding pad layer. Again, the under ball metallurgy layers are still individually formed, so electroless plating also increases the manufacturing time and the manufacturing costs.

SUMMARY OF THE INVENTION

The invention provides a bonding pad structure and a method for fabricating the same. In the invention, under ball metallurgy layers over a bonding pad and a bonding region are simultaneously formed by electroless plating so that manufacturing processes are simplified and manufacturing costs are reduced. Furthermore, the under ball metallurgy layers can provide good bondability and solderability. Intermediate plated layers are located between the bonding region and the under ball metallurgy layer, as well as between the bonding pad and the under ball metallurgy layer, to improve adhesion between the under ball metallurgy layer and the metal bonding pad, and the under ball metallurgy layer and the bonding region.

The invention provides a bonding pad structure. A substrate having a first surface and a second surface is provided. A metal bonding pad and a bonding region are respectively located on the first surface and the second surface. Intermediate plated layers are located on the metal bonding pad and the bonding region. Under ball metallurgy layers are on each of the intermediate plated layers such that each of the under ball metallurgy layers comprises a first plated layer and a second plated layer.

The invention provides a method for fabricating a bonding pad structure. A substrate having a first surface and a second surface is provided. A metal bonding pad is formed on the first surface, and a bonding region is defined on the second region. Intermediate plated layers are simultaneously formed on the metal bonding pad and the bonding region by electroless plating. Then, under ball metallurgy layers are simultaneously formed on each of the intermediate plated layers by electroless plating in which each of the under ball metallurgy layers comprises a first plated layers and a second plated layer.

In the invention, the intermediate plated layers are formed simultaneously by electroless plating, and the under ball metallurgy layers are the same. By this invention, the manufacturing processes are simplified, and the manufacturing costs and the manufacturing time are both reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 3A through 3D are schematic, cross-sectional diagrams of a method for fabricating a bonding pad structure according to the invention.

Figure 1:
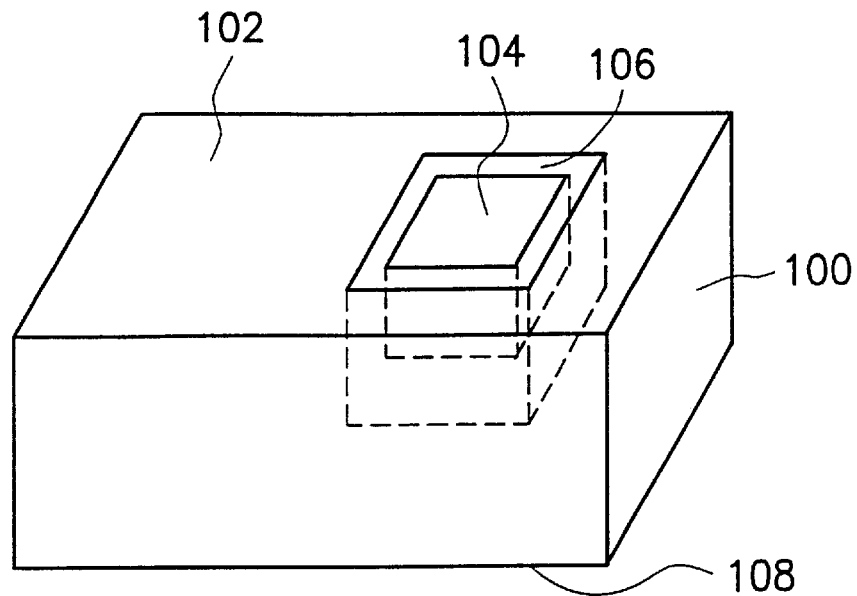
FIG. 1 is a schematic, three-dimensional diagram of a conventional power device.
Figure 2:
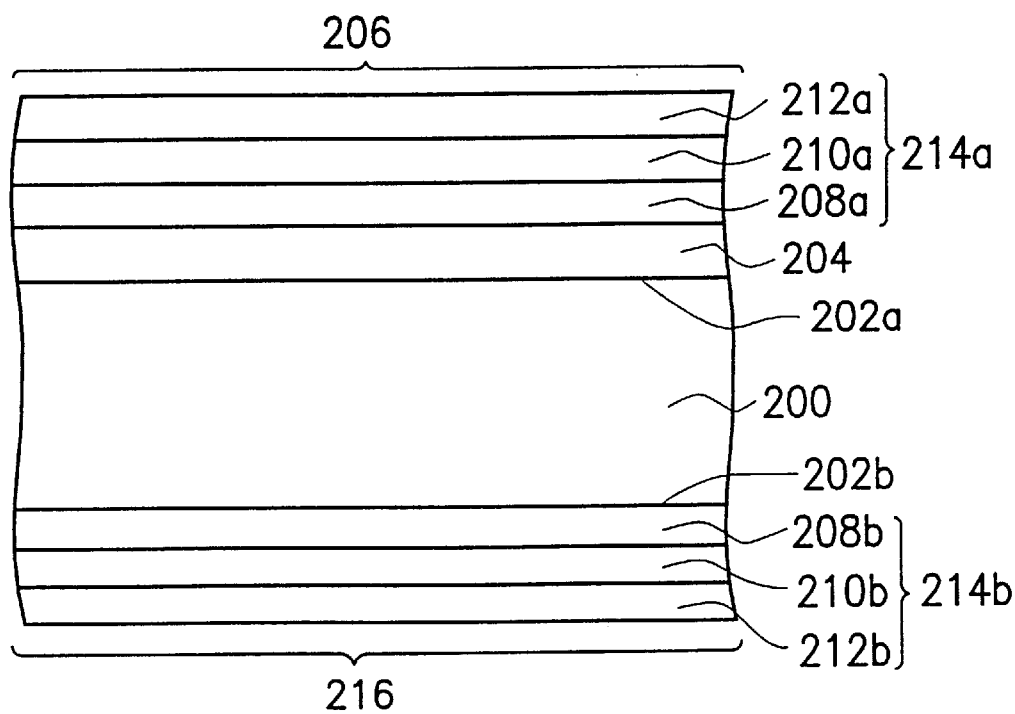
FIG. 2 is a schematic, cross-sectional diagram of a conventional bonding pad structure of a power device.
Figure 3A:
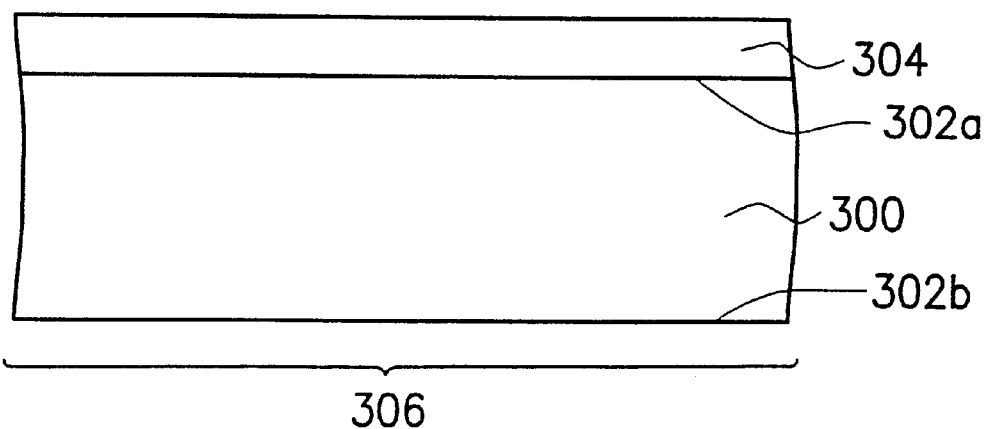
FIGS. 3A through 3D are schematic, cross-sectional diagrams of a method for fabricating a bonding pad structure according to the invention.

Referring to FIG. 3A, a substrate 300 having surfaces 302a, 302b is provided. The substrate 300 includes devices (not shown) such as power devices. A metal bonding pad 304 is formed on the surface 302a, and a bonding region 306 is defined on the surface 302b. The metal bonding pad 304 includes aluminum or other kinds of conductive metal.

The substrate 300 is cleaned by performing a cleaning process. For example, the cleaning process includes the following steps. The substrate 300 is degreased by acetone for about 10 minutes. The substrate 300 is rinsed with deionized water for about 2 minutes. The substrate 300 is then etched by a mixture comprising hydrofluoric acid (HF) and nitric acid ($HNO_3$) for about 2 minutes. In the mixture, the concentration of hydrofluoric acid is preferably about 5 ml/L, and that of nitric acid is about 200 ml/L. The substrate 300 is rinsed with deionized water for about 2 minutes.

Figure 3B:
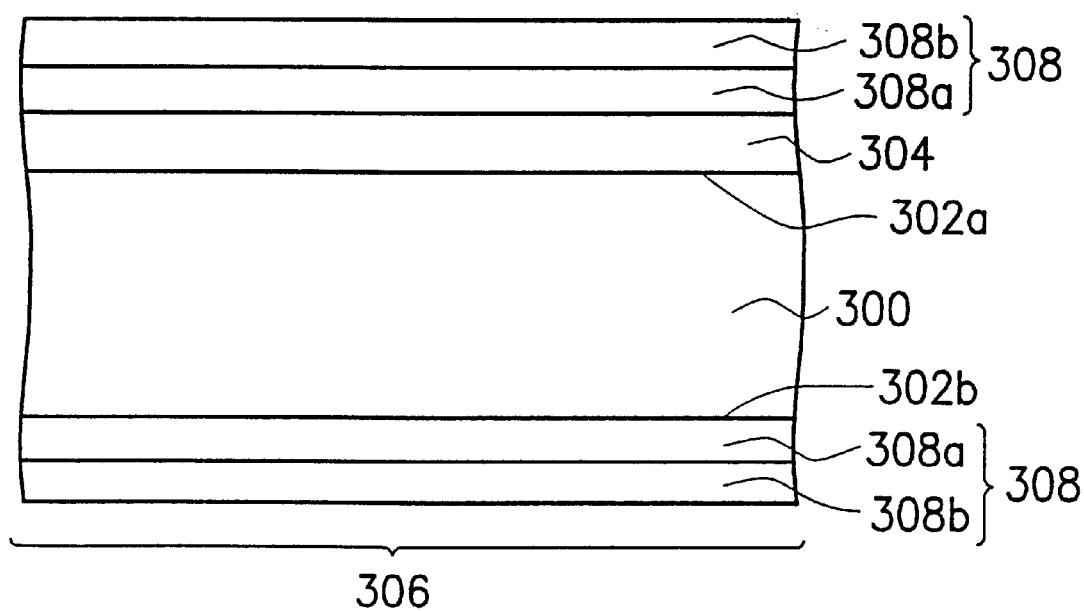

Referring to FIG. 3B, an electroless plating process is performed; intermediate plated layers 308a are simultaneously formed on the metal bonding pad 304 and the bonding region 306. The thickness of the intermediate plated layer 308a on the metal bonding pad 304 is approximately equal to that of the intermediate plated layer 308a on the bonding region 306. The intermediate plated layers 308a include zinc, and the intermediate plated layers 308a are preferably formed by the following steps. The substrate 300 is dipped in a zincate solution for about 2 minutes to form the intermediate plated layers 308a. Then, the substrate 300 is rinsed with deionized water for about 5 minutes. The substrate 300 is dipped in a solution including nitric acid and water to roughen surfaces of the intermediate plated layers 308a. The substrate 300 is then rinsed with deionized water. By roughening surfaces of the intermediate plated layers 308a, adhesion between the intermediate plated layers 308a and subsequently formed intermediate plated layers can be improved and the thicknesses of the subsequently formed intermediate plated layers can also be uniform.

Intermediate plated layers 308b are then simultaneously formed on each of the intermediate plated layers 308a. The material and the method of forming the intermediate plated layers 308b are similar to those of the intermediate plated layers 308a, so detailed descriptions are omitted here. Additionally, the thickness of the intermediate plated layer 308a is approximately equal to that of the intermediate plated layer 308b. Each of the intermediate plated layers 308a and each of the intermediate plated layers 308b constitute an intermediate layer 308.

Figure 3C:
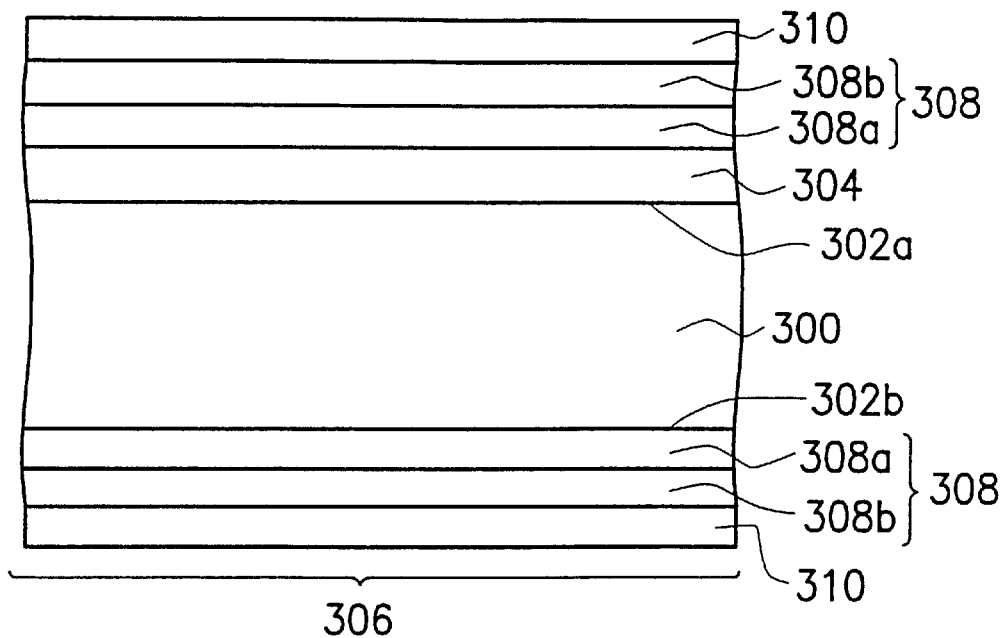

Referring to FIG. 3C, an electroless plating process is performed after the intermediate plated layers 308 are formed on the metal bonding pad 304 and the bonding region 306; then, plated layers 310 are simultaneously formed on each of the intermediate plated layer 308. The plated layer 310 includes nickel. The method of forming the plated layer 310 preferably includes the following steps. The substrate 300 is dipped in a nickel kit solution whose pH value is about 8.8–9.0 at about 90° C. for about 10 minutes, and then the substrate 300 is rinsed with deionized water for about 2 minutes. Since the plated layers 310 are both formed on the intermediate plated layers 308 such that each of the intermediate plated layers 308 has the same material and the same thickness, the thicknesses of the plated layers 310 are both uniform.

Figure 3D:
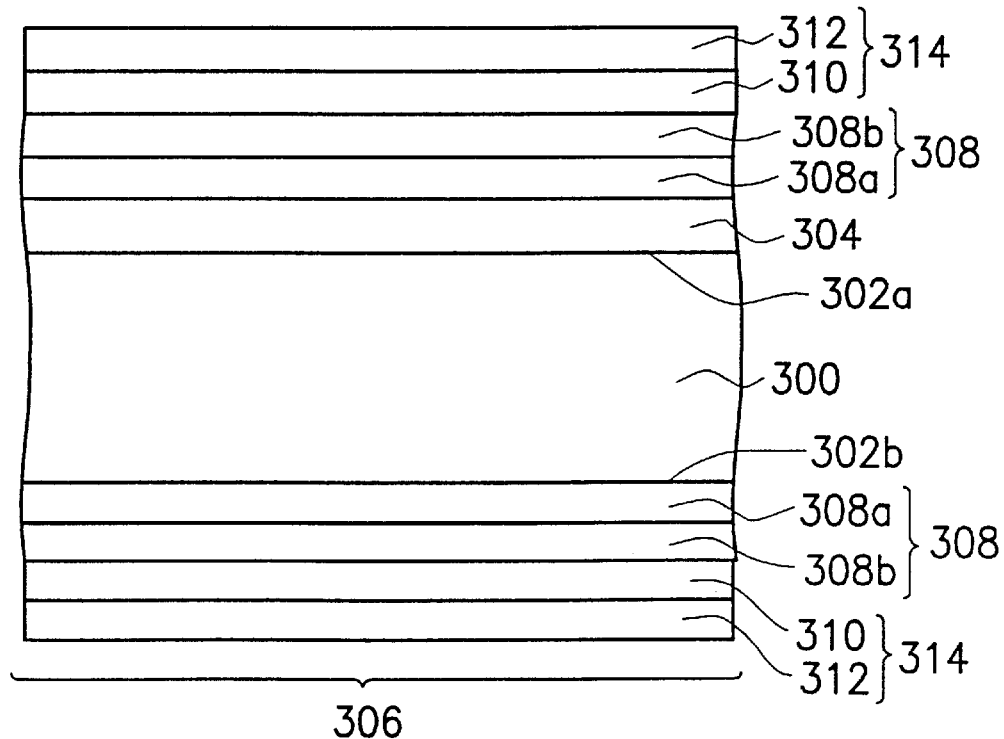

Referring to FIG. 3D, an electroless plating process is performed after the plated layers 310 are formed; plated layers 312 which are, for example, gold are formed on each of the plated layer 310. Each of the plated layers 310 and each of the plated layers 312 constitute an under ball metallurgy layer 314. The method of forming the plated layer 312 includes the following steps. The substrate 300 is dipped in an aurosine solution whose pH value is about 7 at about 90° C. for about 1.5 minutes, and then the substrate 300 is rinsed with deionized water for about 2 minutes. Then, the substrate 300 is dipped into an acetone solution for cleaning. Because the plated layers 312 are both formed on the plated layers 310 that each of the plated layers 310 also has the same material and the same thickness, the thicknesses of the plated layers 312 are both uniform.

In the invention, the intermediate plated layers are formed simultaneously on the metal bonding pad and the bonding region by electroless plating; thus, the manufacturing processes are simplified. Additionally, the intermediate plated layers improve adhesion between the under ball metallurgy layer and the metal bonding pad, and the under ball metallurgy layer and the bonding region.

Since the thicknesses of the under ball metallurgy layers are uniform, the electronic character of the under ball metallurgy layers can be maintained. Furthermore, the under ball metallurgy layers can provide good bondability and solderability; thus, the reliability and the yield are increased.

In the invention, the intermediate plated layers are formed simultaneously by electroless plating, and the under ball metallurgy layers are the same. As a result, the manufacturing processes are simplified, and the manufacturing costs and the manufacturing time are both reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a bonding pad structure, comprising the steps of:

providing a substrate having a first surface and a second surface, wherein a metal bonding pad is formed on the first surface, and a bonding region is defined on the second surface;

cleaning the substrate;

forming intermediate plated layers on the metal bonding pad and the bonding region, simultaneously;

forming a first plated layer on each of the intermediate plated layers; and forming a second plated layer on each of the first plated layers.

2. The method of claim 1, wherein the substrate is cleaned with acetone.

3. The method of claim 1, wherein the substrate is cleaned with deionized water.

4. The method of claim 1, wherein the substrate is cleaned with a mixture comprising hydrofluoric acid and nitric acid.

5. The method of claim 4, wherein concentration of hydrofluoric acid in the mixture is about 5 ml/L.

6. The method of claim 4, wherein concentration of nitric acid in the mixture is about 200 ml/L.

7. The method of claim 4, wherein the substrate is cleaned with deionized water after it is cleaned with the mixture.

8. The method of claim 1, wherein the intermediate plated layers include zinc.

9. The method of claim 1, the method of forming the intermediate plated layers comprising:

dipping the substrate into a zincate solution to form first intermediate plated layers on the metal pad and the bonding region, simultaneously;

cleaning the substrate with deionized water;

dipping the substrate into a nitric acid solution to roughen surfaces of the first intermediate plated layers;

cleaning the substrate with deionized water; and dipping the substrate into the zincate solution to form second intermediate plated layers on each of first intermediate plated layers, simultaneously, after which each of the intermediate plated layer comprises one first intermediate plated layer and one second intermediate plated layer.

10. The method of claim 1, wherein the first plated layers include nickel.

11. The method of claim 1, wherein the substrate is preferably dipped into a nickel kit solution whose pH value is about 8.8–9.0 at about 90° C. to form the first plated layers.

12. The method of claim 1, wherein the substrate is cleaned with deionized water after the first plated layers are formed.

13. The method of claim 1, wherein the second plated layers include gold.

14. The method of claim 1, wherein the substrate is preferably dipped into an aurosine solution whose pH value is about 7 at about 90° C. to form the second plated layers.

15. The method of claim 1, wherein the substrate is cleaned with deionized water after the second plated layers are formed.

16. The method of claim 1, wherein the substrate is cleaned with acetone after the second plated layers are formed.

17. A method for fabricating a bonding pad, comprising the steps of:

cleaning the substrate;

simultaneously forming first intermediate plated layers on the metal bonding pad and the bonding region, wherein the first intermediate plated layers are made from zinc;

simultaneously forming second intermediate plated layers on each of the first intermediate plated layers;

simultaneously forming first plated layers on each of the second intermediate plated layers, wherein the first plated layers are made from nickel; and simultaneously forming second plated layers on each of the first plated layers, wherein the second plated layers are made from gold.

* * * * *